United States Patent
Sawasaki et al.

(12)

(10) Patent No.: US 6,277,495 B1
(45) Date of Patent: Aug. 21, 2001

(54) POLYIMIDE FILM, A METHOD FOR ITS MANUFACTURE AND A POLYIMIDE FILM CONTAINING METAL LAMINATED PLATE

(75) Inventors: Koichi Sawasaki, Chita; Kenji Uhara; Michihiro Kubo, both of Nagoya, all of (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/115,133

(22) Filed: Jul. 14, 1998

(30) Foreign Application Priority Data

Jul. 18, 1997 (JP) ........................................ 9-209949

(51) Int. Cl.[7] ............................. B32B 15/08; C08G 73/10
(52) U.S. Cl. ........................ 428/458; 428/473.5; 528/171; 528/172; 528/173; 528/175; 528/183; 528/188; 528/220; 528/229; 528/350; 528/353; 528/502 B
(58) Field of Search ................................ 428/458, 473.5; 528/171, 172, 173, 175, 183, 188, 220, 229, 350, 353, 502 B

(56) References Cited

FOREIGN PATENT DOCUMENTS

| | | |
|---|---|---|
| 0 189 643 A2 | 8/1986 | (EP) . |
| 0 276 405 A2 | 8/1988 | (EP) . |
| 0 455 208 A2 | 11/1991 | (EP) . |
| 0 491 307 A1 | 6/1992 | (EP) . |
| 0 879 839 A1 | 11/1998 | (EP) . |
| 59-164328 | 9/1984 | (JP) . |
| 60-210629 | 10/1985 | (JP) . |
| 61-111359 | 5/1986 | (JP) . |
| 10-20238 | 1/1989 | (JP) . |
| 64-16832 | 1/1989 | (JP) . |
| 64-16833 | 1/1989 | (JP) . |
| 64-16834 | 1/1989 | (JP) . |
| 1-131241 | 5/1989 | (JP) . |
| 1-131242 | 5/1989 | (JP) . |
| 50-25273 | 2/1993 | (JP) . |
| 93 17069 | 9/1993 | (WO) . |

OTHER PUBLICATIONS

Patent Abstracts of Japan, vol. 098, No. 001, Jan. 30, 1998 and JP 09235373 Sep. 9, 1997.

*Primary Examiner*—D. S. Nakarani

(57) ABSTRACT

A polyimide film of birefringence less than 0.01 is formed by drawing a copolymerized polyimide comprising a block component and a random component which are molecularly bonded, wherein the block component of copolymerized polyimide comprises an aromatic diamine compound having a rigid structure and an aromatic tetracarboxylic acid compound and wherein the random component of copolymerized polyimide comprises an aromatic diamine compound having a flexible structure and at least two aromatic tetracarboxylic acid components. The resulting polyimide film has high elasticity, a low thermal expansion equivalent to that of metal and low water absorbing properties. A method for its manufacture and a metal laminated plate having improved curl properties in which the polyimide is used as the base material are also disclosed.

14 Claims, No Drawings

POLYIMIDE FILM, A METHOD FOR ITS MANUFACTURE AND A POLYIMIDE FILM CONTAINING METAL LAMINATED PLATE

FIELD OF THE INVENTION

This invention relates to a polyimide film which has high elasticity, low thermal expansion properties equal to those of metals and low water absorption properties, a method for its manufacture and a metal laminated plate of improved curl containing the polyimide film as the base material.

BACKGROUND OF THE INVENTION

Polyimides that are obtained by condensation polymerization of pyromellitic dianhydride and 4,4'-diaminodiphenyl ether have superior heat resistance and electrical insulating capacity and are used primarily for flexible printed circuit boards. Most recently, their uses have been expanded to semiconductor packages. High processability and capacity for high precision are required, a high modulus of elasticity, low thermal expansion characteristics like that of metals and low water absorbing capacity are sought as the characteristics of polyimides and various studies have been conducted. For example, in Japanese Patent Application Public Disclosure No. 60-210629 [1985], Japanese Patent Application Public Disclosure No. 64-16832 [1989], Japanese Patent Application Public Disclosure No. 64-16833 [1989], Japanese Patent Application Public Disclosure No. 64-16834 [1989], Japanese Patent Application Public Disclosure No. 1-131241 [1989] and Japanese Patent Application Public Disclosure No. 1-131242 [1989], an example of a three component polyimide comprised of pyromellitic dianhydride, 4,4'-diaminodiphenyl ether and p-phenylenediamine is described in which p-phenylenediamine is used in combination as the diamine component for the purpose of increasing the modulus of elasticity. Expansion to a four component polyimide can also be effected by adding 3,3'-4,4'-biphenyltetracarboxylic acid dianhydride to the aforementioned three-component system for the purpose increasing the modulus of elasticity. Examples of four component polyimides are described in Japanese Patent Application Public Disclosure No. 59-164328 [1984] and Japanese Patent Application Public Disclosure No. 61-111359 [1986]. In addition, an attempt to improve the physical properties of four component polyimides by controlling the procedure of addition of the monomers during polymerization is presented, for example, in Japanese Patent Application Public Disclosure No. 5-25273 [1993]. Further, an attempt to improve physical properties by drawing during film making is described, for example, in Japanese Patent Application Public Disclosure No. 1-20238 [1989].

A high modulus of elasticity, low thermal expansion capacity equivalent to that of metals and low water absorbing capacity are necessary as characteristics for use in semiconductor packages as described above. Although the three-component polyimides that are obtained in Japanese Patent Application Public Disclosure No. 60-210629 [1985], Japanese Patent Application Public Disclosure No. 64-16832 [1989], Japanese Patent Application Public Disclosure No. 64-16833 [1989], Japanese Patent Application Public Disclosure No. 64-16834 [1989], Japanese Patent Application Public Disclosure No. 1-131241 [1989] and Japanese Patent Application Public Disclosure No. 1-131242 [1989] have a higher modulus of elasticity than the polyimides that are obtained from pyromellitic dianhydride and 4,4'-diaminodiphenyl ether, a modulus of elasticity sufficient for use as semiconductor packages cannot be obtained. Further, with the four-component polyimides that are obtained in Japanese Patent Application Public Disclosure No. 59-164328 [1984] and Japanese Patent Application Public Disclosure No. 61-111359 [1986], it is necessary to use a large quantity of p-phenylenediamine for the purpose of obtaining a sufficient modulus of elasticity. As a result, there is the problem that the coefficient of thermal expansion becomes excessively lower than that of the metal. With the four component polyimide described in Japanese Patent Application Public Disclosure No. 5-25273 [1993], the modulus of elasticity and thermal expansion capacity are sufficient for this use. However, there is the problem that there is a high coefficient of water absorption. Further, with the three-component polyimide that is obtained in Japanese Patent Application Public Disclosure No. 1-20238 [1989], there are the problems in that the modulus of elasticity is markedly increased and that flexibility is lost as a result of drawing, that the coefficient of thermal expansion is considerably decreased and that there are great differences in thermal behavior from the metal when the film is affixed.

Consequently, this invention has the objective of providing a polyimide film of high elasticity, low thermal expansion characteristics equal to those of metal and low water absorbing capacity, a method for its manufacture and metal laminated plates of improved curl in which it is the base material.

SUMMARY OF THE INVENTION

This invention, which solves the aforementioned problems, is a polyimide film having a birefringence less than 0.01 and a coefficient of thermal expansion of 10 to 22 ppm/° C. comprising a block component and a random component which are molecularly bonded, wherein the block component of the polyimide comprises a segment derived from an aromatic diamine compound of a rigid structure and an aromatic tetracarboxylic acid compound, and the random component of the copolymerized polyimide comprises a segment derived from an aromatic diamine compound of a flexible structure and at least two types of aromatic tetracarboxylic acid compounds.

In a separate embodiment of the invention is described a method for the manufacture of polyimide film characterized in that an aromatic diamine compound having a rigid structure and an aromatic tetracarboxylic acid compound are mixed for the time required for reaction in an organic solvent that is nonreactive with the reaction components at a ratio of aromatic tetracarboxylic acid compound of 95 to 105 mole % relative to the aromatic diamine compound having a rigid structure, after which the aromatic diamine compound having a flexible structure is added, the aromatic tetracarboxylic acid compound (A) is then added and a different aromatic tetracarboxylic acid compound (B; A≠B) is added so that the total aromatic tetracarboxylic acid compound, i.e., (A)+(B), and total aromatic diamine component are in an essentially equimolar quantity, these substances then being mixed for the time required for reaction and the copolymerized polyamic acid solution that is obtained is cyclized, after which drawing is performed, the solvent is eliminated and formation is effected and a metal laminated plate characterized in that the polyimide film described that is obtained in this way is used as the base material and is laminated with metal.

DETAILED DESCRIPTION OF THE INVENTION

The block component of the polyimide that forms the copolymerized polyimide of this invention consists of repeated polyimide molecular chains that are obtained from one aromatic diamine compound having a rigid structure and one aromatic tetracarboxylic acid compound and is obtained by formation in the first stage of polymerization. The random component of the copolymerized polyimide is formed by reacting the aromatic diamine compound having a flexible structure and at least two or more aromatic tetracarboxylic acid compound in the second stage of polymerization. The polyimide film that has been formed by drawing a copolymerized polyimide that is formed by molecular bonding of the block component of the polyimide and the random component of the copolymerized polyimide that are obtained in this way can have the superior physical properties of high elasticity, low thermal expansion characteristics equivalent to those of metal and low water absorbing characteristics.

It is essential that the birefringence of the polyimide film that is obtained by drawing be controlled to less than 0.01. When the birefringence is greater than 0.01, the anisotropy of the film increases and curl readily occurs when it is affixed to the film. This is not desirable.

It is desirable that the coefficient of thermal expansion of the polyimide film that is obtained by drawing be controlled within a range of 10 to 22 ppm/° C. When it is outside of this range, differences in the thermal behavior of the metal, the IC chip and the epoxy base material occur and there are great changes in dimensions. There are instances in which this is undesirable.

Examples of the aromatic diamine compounds having a rigid structure that are used in this invention that can be cited include compounds as indicated by general formula (I) below.

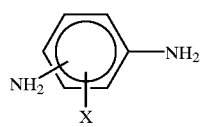

(I)

wherein X indicates a monovalent substitution group that can be selected from hydrogen, halogen groups, carboxyl groups, lower alkyl groups and lower alkoxy groups.

Among the aromatic diamine compounds having a rigid structure as indicated by general formula (I), it is desirable to use compounds in which X is hydrogen from the standpoint of increasing the modulus of elasticity of the polyimide film that is obtained. Of these compounds, the use of p-phenylenediamine is particularly desirable.

Examples of the aromatic diamine compounds having a flexible structure that are used in this invention that can be cited include compounds as indicated by general formula (II) below.

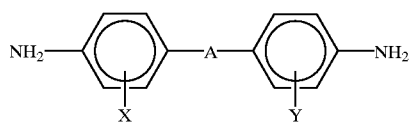

(II)

wherein X and Y indicate monovalent substitution groups that are selected from hydrogen, halogen groups, carboxyl groups, lower alkyl groups and lower alkoxy groups and X and Y may be substituted groups that are the same or different; and A indicates a divalent coupled group that is selected from —O—, —S—, —CO—, —SO—, $SO_2$— and —$CH_2$—.)

Among the aromatic diamine compounds having a flexible structure as indicated by general formula (II), aromatic diamine compounds without any substitution groups except for amino groups as shown in formula (III) below are preferable from the standpoint of increasing the forming capacity of the polyimide film that is obtained.

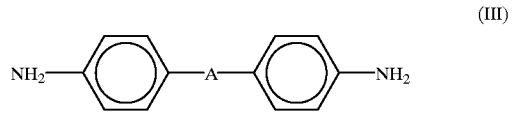

(III)

(A indicates a divalent coupling group that is selected from —O—, —S—, —CO—, —SO—, -$SO_2$— and —$CH_2$—.

Of these, the use of 4,4'-diaminodiphenyl ether is particularly desirable.

It is desirable that the proportions of the aromatic diamine compounds that are used relative to the total aromatic diamine components are 12 mol % to 30 mol % of aromatic diamine compound having a rigid structure and 70 mol % to 88 mol % of aromatic diamine compound having a flexible structure. When the proportion of aromatic diamine having a rigid structure that is used is less than aforementioned proportion and when the proportion of aromatic diamine compound having a flexible structure is excessively great, the modulus of elasticity of the polyimide film that is obtained is decreased and its coefficient of thermal expansion is increased. This is not desirable. Further, when the proportion of aromatic diamine having a rigid structure used is greater than the aforementioned proportion and when the proportion of aromatic diamine compound having a flexible structure used is decreased, the coefficient of water absorption of the polyimide film is increased, its coefficient of thermal expansion is excessively decreased, its modulus of elasticity is excessively increased and formability is lost. This is not desirable.

It is desirable that the aromatic tetracarboxylic acid compounds that are used may be one or more compounds selected from pyromellitic acid compounds, 3,3'-4,4'-biphenyltetracarboxylic acid compounds and 3 ,3'-4,4'-benzophenone-tetracarboxylic acid compounds.

Aromatic tetracarboxylic acid compounds that can be used include pyromellitic acid or dianhydrides thereof as the pyromellitic acid compounds, 3,3'-4,4'-biphenyltetracarboxylic acid or dianhydrides thereof as the 3,3'-4,4'-biphenyltetracarboxylic acid compounds and 3,3'-4,4'-benzo-phenonetetracarboxylic acid or dianhydrides thereof as the 3,3'-4,4'-benzophenone-tetracarboxylic acid compounds.

It is desirable that the proportions of the aromatic tetracarboxylic acid compounds that are used relative to the total aromatic diamine components may be 50 mol to 80 mol % of pyromellitic acid compounds and 20 mol % to 50 mol % of 3,3'-4,4'-biphenyltetracarboxylic acid compounds and/or 3,3'-4,4'-benzophenonetetracarboxylic acid compounds. When the proportion of 3,3'-4,4'-biphenyltetracarboxylic acid compounds and/or 3,3'-4,4'-benzophenonetetracarboxylic acid compounds used is less than the aforementioned proportion, the modulus of elasticity of the polyimide film that is obtained is decreased and the coefficient of water absorption is increased. This is not desirable. Further, when the proportion of 3,3 '-4,4'-biphenyltetracarboxylic acid compounds and/or 3,3 '-4,4'-benzophenonetetracarboxylic acid compounds used is greater than the aforementioned proportion, the gas permeability of the polyimide film that is obtained deteriorates, bubbles are formed on the surface of the film and the adhesive strength of the film is decreased. This is not desirable. The 3,3'-4,4'-biphenyltetra-carboxylic acid compounds and 3,3'-4,4'-benzophenonetetra-carboxylic acid compounds may be used independently or they may be used as mixtures.

Next, we shall describe the method of manufacture of the polyimide film of this invention. First, in order to form the block component of the polyimide, one aromatic diamine compound having a rigid structure and one aromatic tetracarboxylic acid are mixed for more than 1 hour in the first stage of polymerization in an organic solvent that is nonreactive with the reaction component. It is desirable that the ratio of aromatic tetracarboxylic acid relative to the aromatic diamine compound that is used should be 95 to 105 mol %. However, 97 to 100 mol % is preferable for forming the block component with good efficiency and for molecular bonding with the random component that is formed in the second stage.

Next, as the second stage of polymerization in order to form the random component of the copolymerized polyimide, an aromatic diamine compound having a flexible structure is added, after which the aromatic tetracarboxylic acid (A) is added and the materials are stirred for longer than 1 hour. Further, the different aromatic tetracarboxylic acid (B), i.e., (A)≈(B), is added in a quantity such that the total aromatic tetracarboxylic acid component and the total aromatic diamine component are essentially equal and the materials are stirred for longer than one hour. In such a series of polymerizations, a polyamic acid solution in which the block polymerized polyamic acid component and the random copolymerized polyamic acid component that are formed in the first stage and the second stage, respectively, are molecularly bonded can be obtained. This polyamic acid solution is then cyclized, after which drawing and elimination of the solvent, are effected, by which means the desired polyimide film can be obtained.

We shall now describe the drawing in said method of manufacture. First, the polyamic acid that has been obtained in the series of reactions is subjected to chemical cyclization using a cyclization catalyst or a dehydrating agent or is subjected to thermal cyclization by a heat treatment, by which means a gel film of polyimide is obtained. Next, the end of the gel film is affixed and it is desirable that drawing is performed in the lengthwise direction at a multiple of 1.05 to 1.5 and in the crosswise direction at a multiple of 1.05 to 2.0. When biaxial drawing of this kind is performed, there is improvement of the mechanical properties and of the anisotropy of the polyimide film that is obtained. This is desirable.

The aromatic tetracarboxylic acids that may be used in the first stage of polymerization in said method of manufacture may be pyromellitic acid compounds, 3,3'-4,4'-biphenonetetracarboxylic acid compounds and 3,3'-4,4'-benzophenonetetracarboxylic acid compounds which may be used individually. When pyromellitic acid compounds are used, they increase the modulus of elasticity of polyimide films that are finally obtained. This is desirable. Aromatic diamine compounds having a rigid structure are used as the aromatic diamines.

In the second stage of polymerization, it is desirable to use one or more compounds selected from pyromellitic acid compounds, 3,3'-4,4'-biphenyltetra-carboxylic acid compounds and 3,3'-4,4'-benzophenonetetracarboxylic acid compounds as the aromatic tetracarboxylic acid compounds. In order to increase the modulus of elasticity of the polyimide film that is finally obtained, it is desirable to use a combination of pyromellitic acid compounds and 3,3'-4,4'-biphenyltetracarboxylic acid compounds. An aromatic diamine compound having a flexible structure is used as the aromatic diamine component.

The solvents that are used in said method of manufacture include dimethyl sulfoxide, N,N-dimethylacetamide, N,N-diethylacetamide, N,N-dimethylformamide, N,N-diethylformamide, N-methyl-2-pyrrolidone and dimethyl sulfone. They may be used individually or in mixtures.

The copolymerized polyamic acid that is obtained by said method of manufacture is prepared in a proportion of 10 to 30 wt % in the aforementioned solvent.

When the copolymerized polyamic acid that is obtained by said method of manufacture is cyclized and made into a copolymerized polyimide, this procedure may be performed by the chemical ring closure method in which dehydration is performed using a dehydrating agent and a catalyst or by the thermal ring closure method in which dehydration is performed thermally. Use of the chemical ring closure method is preferable because the modulus of elasticity of the polyimide film that is obtained is increased, because its coefficient of thermal expansion is decreased and because chemical etching capacity, which is required for TAB uses, can be conferred. The dehydrating agents that can be used include aliphatic acid anhydrides such as acetic anhydride and aromatic acid anhydrides such as phthalic anhydride. They may be used individually or in mixtures. The catalysts that may be used include heterocyclic tertiary amines such as pyridine, picoline and quinoline, aliphatic tertiary amines such as triethylamide and aromatic tertiary amines such as N,N-dimethylaniline. They may be used individually or in mixtures.

The metal laminated plate of this invention may be a three-layer structure in which electroconductive metal foil is laminated on the surface of the polyimide film, which is the base material, through the use of an adhesive agent such as a polyester base, an acrylic base, an epoxy base or a polyimide base or it may be a two-layer structure in which an electroconductive metal foil is laminated directly on the surface of the polyimide film without the use of an adhesive agent.

EXAMPLES

We shall now describe this invention in specific terms by means of examples.

GLOSSARY
PPD p-phenylenediamine
ODA 4,4'-diaminophenyl ether
PMDA pyromellitic dianhydride
BPDA 3,3'-,4,4'-diphenyltetracarboxylic dianhydride
BTDA 3,3'-4,4'-dibenzophenonetetracarboxylic dianhydride
DMAc N,N-dimethylacetamide.

Example 1

239.1 g of DMAc were introduced into a 500 ml separable flask, 1.870 g (0.0173 mole) of PPD and 3.659 g (0.0168 mole) of PMDA were then introduced and a reaction was carried out for 1 hour at normal temperature and normal pressure. Next, 25.398 g (0.1268 mole) of ODA were introduced and the mixture was stirred until it was uniform, after which 8.481 g (0.0288) of BPDA were added and a reaction was carried out for 1 hour. Next, 21.491 g (0.0985 mole) of PMDA were added and a reaction was carried out for an additional 1 hour, with a polyamic acid solution being obtained. The molar ratios of each raw material added in this polymerization were in the proportions shown in Table 1 and the total weight of solid component was prepared to 60.9 g. 15 g of this polyamic acid solution were placed on a polyester film of 125 μg in thickness, after which the material was rotated for 1 minute at a rotational speed of 2500 rpm with a 1H-360A spin coater manufactured by Mikasa. Next, it was immersed for 10 minutes in a mixed solution of acetic anhydride and β-picoline, with an imidation reaction being effected, after which the polyimide gel film was peeled from the polyester film, the end of the gel film was pinned and drawing was performed 1.15 times in the lengthwise direction and 1.30 times in the crosswise direction. Following that, it was desiccated by heating for 20 minutes at 300° C. and then for 5 minutes at 400° C. The pinning was removed, with a polyimide film of approximately 25 μm in thickness being obtained. The properties of this film were evaluated and the results are shown in Table 1.

The properties were evaluated by the following methods.
Evaluation methods
  (1) Modulus of elasticity Equipment: RTM-250 Drawing speed: 100 mm/min Load: 10 kg
  (2) Coefficient of thermal expansion Equipment: TMA-50 Determination temperature range: 50 to 200° C. Temperature elevation speed: 10° C./min
  (3) Coefficient of water absorption
  The material was allowed to stand for 2 days in a desiccator in an atmosphere at 98% humidity and the evaluation was made in terms of the % of weight increase relative to the original weight.
  (4) Birefringence Equipment: KOBRA-21ADH Light source: Sodium lamp Angle of incidence: 0° Determination formula: $\Delta N_{xy}$=(retardation)/film thickness
  (5) Evaluation of amount of curl of the metal laminated plate
  An epoxy base adhesive agent was applied to the polyimide film and copper film was affixed to it at a temperature of 130° C. Following that, the temperature was raised to a maximum temperature of 160° C. to harden the adhesive agent, the metal laminated plate that was obtained was cut to a sample size of 25 mm×120 mm and it was allowed to stand for 24 hours at 60 RH %, after which the curl of the samples was measured. Curl was evaluated by placing the samples on level ground and by determining and averaging the heights of the squares. When the quantity of curl exceeded 3 mm, there were many instances in which handling in post-processing was extremely difficult when the product was to be used as metal laminated plate.

Examples 2 to 10

Polyamic acid solutions were obtained by the same procedure as in Example 1 with the aromatic diamine component and the aromatic tetracarboxylic acid component in the proportions shown in Table 1, after which drawing in the crosswise direction and lengthwise direction was performed at the multiples shown in Table 1 and the properties of the polyimide film obtained were evaluated by the same procedures as in Example 1. The results are shown in Table 1. The results for the amount of curl of the metal laminated plate for the polyimide film obtained in Example 3 (coefficient of thermal expansion: 17.5 ppm/° C.; birefringence: 0.0094) are shown in Table 3.

Example 11

A polyamic acid solution was obtained by the same method as in Example 1 except that the BPDA was replaced by BTDA and the quantities of raw material added were in the proportions shown in Table 1. The physical properties of the polyamide film that were obtained were then evaluated by the same procedures as in Example 1. The results are shown in Table 1.

Example 12

239.1 g of DMAc were introduced into a 500 ml separable flask, PPD and BPDA were then introduced and a reaction was carried out for 1 hour at normal temperature and normal pressure. Next, ODA was introduced and the mixture was stirred until it was uniform, after which BPDA was added and a reaction was carried out for 1 hour. Next PMDA was added and the reaction was carried out for an additional hour, with a polyamic acid solution being obtained. The quantities of each raw material that were added in this polymerization were in the proportions shown in Table 1. The total weight of the solid component was prepared to 60.9 g. Following that, the procedures for obtaining the polyimide film from the polyamic acid solution were performed in the same way as in Example 1. Table 1 shows the results of the evaluations of the physical properties of the polyimide film.

Comparative Example 1

The aromatic diamine component and the aromatic tetracarboxylic acid component were reacted and subjected to imidation in the same proportions and by the same procedures as in Example 1, after which the ends were pinned without drawing and desiccation was carried out by heating for 20 minutes at 300° C. and then for 5 minutes at 400° C. The pinning was then removed and a polyimide film of approximately 25 μm in thickness was obtained. Table 2 shows the results of the evaluations of the physical properties of this film.

Comparative Example 2

239.1 g of DMAc were introduced into a 500 ml separable flask, ODA and PMDA were then added, a reaction was carried out for 1 hour in normal temperature and normal pressures and a polyamic acid solution was obtained. The molar ratio of ODA and PMDA was essentially 1:1. The total weight of the solid component was prepared to 60.9 g. Following that, the polyimide film that was obtained from the polyamic acid solution was drawn in the crosswise direction and lengthwise direction at the multiples shown in Table 2. The physical properties of the polyimide film that was obtained were evaluated by the same procedures as in Example 1. The results of the evaluations are shown in Table 2.

Comparative Example 3

239.1 g of DMAc were introduced into a 500 ml separable flask, PPD and PMDA were added and a reaction was carried out for 1 hour at normal temperature and normal pressure. Next, ODA was introduced and the mixture was stirred until it was uniform, after which PMDA was added, a reaction was carried out for 1 hour and a polyamic acid solution was obtained. The quantities of each raw material that were added in this polymerization were in the proportions shown in Table 2. The total weight of the solid component was 60.9 g. Following that, the polyamide film, which was obtained from the polyamic acid solution, was drawn in the crosswise direction and the lengthwise direction in the multiples shown in Table 2. The other procedures were performed in the same way as in Example 1. The results of the evaluations of the physical properties of the polyimide film that were obtained are shown in Table 2. Table 3 shows the results that were obtained for the amount of curl of the metal laminated plate containing the polyimide film.

was adjusted to 60.9 g. Following that, the polyimide film that was obtained from the polyamic acid solutions was drawn in the crosswise direction and the lengthwise direction in the multiples shown in Table 2. The other procedures were performed in the same way as in Example 1. Table 2 shows the results of the evaluations of the physical properties of the polyimide film that were obtained.

TABLE 1

| Example | 1 | 2 | 3 | 4 | 5 | 6 |
|---|---|---|---|---|---|---|
| Type added and proportion (molar ratio*) | PPD 12.0<br>PMDA 11.6<br>ODA 88.0<br>BPDA 20.0<br>PMDA 68.4 | PPD 12.0<br>PMDA 11.6<br>ODA 88.0<br>BPDA 30.0<br>PMDA 58.4 | PPD 12<br>PMDA 12<br>ODA 88<br>BPDA 50<br>PMDA 38 | PPD 18.0<br>PMDA 17.8<br>ODA 82.0<br>BPDA 30.0<br>PMDA 52.2 | PPD 20.0<br>PMDA 19.4<br>ODA 80.0<br>BPDA 40.0<br>PMDA 40.6 | PPD 25<br>PMDA 25<br>ODA 75<br>BPDA 20<br>PMDA 55 |
| Drawing multiple in lengthwise direction | 1.15 | 115 | 1.15 | 1.15 | 1.30 | 1.15 |
| Drawing multiple in crosswise direction | 1.30 | 1.30 | 1.30 | 1.30 | 1.50 | 1.30 |
| Modulus of elasticity (kg/mm$^2$) | 535 | 540 | 570 | 585 | 615 | 635 |
| Coefficient of thermal expansion (ppm/° C.) | 18.6 | 18.8 | 17.5 | 16.3 | 14.8 | 11.7 |
| Water absorption (%) | 1.8 | 1.7 | 1.5 | 1.7 | 1.6 | 2.0 |
| Birefringence | 0.0090 | 0.0090 | 0.0094 | 0.0084 | 0.0073 | 0.0077 |

| Example | 7 | 8 | 9 | 10 | 11 | 12 |
|---|---|---|---|---|---|---|
| Type added and proportion (molar ratio*) | PPD 25.0<br>PMDA 24.8<br>ODA 75.0<br>BPDA 25.0<br>PMDA 50.2 | PPD 25.0<br>PMDA 24.8<br>ODA 75.0<br>BPDA 35.0<br>PMDA 40.2 | PPD 30.0<br>PMDA 29.1<br>ODA 70.0<br>BPDA 25.0<br>PMDA 45.9 | PPD 30.0<br>PMDA 29.1<br>ODA 70.0<br>BPDA 35.0<br>PMDA 35.9 | PPD 25.0<br>PMDA 24.3<br>ODA 75.0<br>BPDA 25.0<br>PMDA 50.7 | PPD 25.0<br>PMDA 24.8<br>ODA 75.0<br>BPDA 9.2<br>PMDA 66.0 |
| Drawing multiple lengthwise direction | 1.15 | 1.15 | 1.15 | 1.15 | 1.15 | 1.15 |
| Drawing multiple in crosswise direction | 1.30 | 1.30 | 1.30 | 1.30 | 1.30 | 1.30 |
| Modulus of elasticity (kg/mm$^2$) | 650 | 660 | 680 | 660 | 605 | 620 |
| Coefficient of thermal expansion (ppm/° C.) | 12.0 | 12.5 | 10.2 | 10.8 | 12.5 | 20.5 |
| Water absorption (%) | 1.9 | 1.7 | 2.1 | 2.0 | 2.1 | 1.5 |
| Birefringence | 0.0078 | 0.0083 | 0.0080 | 0.0078 | 0.0085 | 0.0082 |

*Molar ratios in the table indicate, respectively:
mol % in total aromatic diamine component;
mol % in total aromatic tetracarboxylic acid component.

TABLE 2

| Comparative Example | 1 | 2 | 3 | 4 |
|---|---|---|---|---|
| Type added and proportion (molar ratio*) | PPD 12.0<br>PMDA 11.6<br>ODA 88.0<br>BPDA 20.0<br>PMDA 68.4 | ODA 100<br>PMDA | PPD 12.0<br>PMDA 11.6<br>ODA 88.0<br>PMDA 88.4 | PPD 25<br>ODA 75<br>BPDA 25<br>PMDA 75 |
| Drawing multiple in lengthwise direction | 1.00 | 1.20 | 1.30 | 1.15 |
| Drawing multiple in crosswise direction | 1.00 | 1.30 | 1.30 | 1.30 |
| Modulus of elasticity (kg/mm$^2$) | 488 | 360 | 490 | 450 |
| Coefficient of thermal expansion (ppm/° C.) | 21.0 | 26.0 | 16.0 | 23.5 |
| Water absorption (%) | 2.2 | 2.4 | 2.4 | 2.0 |
| Birefringence | 0.0020 | 0.022 | 0.019 | 0.0090 |

*Molar ratios in the table indicate, respectively:
mol % in total aromatic diamine component;
mol % in total aromatic tetracarboxylic acid component.

Comparative Example 4

239.1 g of DMAc were introduced into a 500 ml separable flask, PPD, ODA, BPDA and PMDA were then added in sequence, a reaction was performed for 2 hours at normal temperature and normal pressure and a polyamic acid solution was obtained. The quantities of each raw material that were added in this polymerization were in the proportions shown in Table 2. The total weight of the solid component

TABLE 3

Evaluation of Metal Laminated Plate

| | Example | Comparative Example |
|---|---|---|
| Coefficient of thermal expansion (ppm/° C.) | 17.5 | 16.0 |
| Birefringence | 0.0094 | 0.019 |
| Amount of curl (mm) | 0.5 | 3.5 |

The polyimide film that is obtained in this invention is a copolymerized polyimide that is constituted of a block polymerized polyimide component and a random polymerized polyimide component, which are molecularly bonded, and when it is drawn its birefringence is less than 0.01 and its coefficient of thermal expansion is 10 to 22 ppm/° C., its mechanical properties are improved. It can have both low thermal expansion properties and low water absorbing properties, and, further the amount of curl of the metal laminated plate can be decreased. Therefor, it can function satisfactorily when it is used for semiconductor packages requiring high dimension stability and high processability.

What is claimed is:

1. A polyimide film having a birefringence less than 0.01, said polyimide film being made from a polyimide copolymer comprising:
   a block component and a random component which are molecularly bonded;
   said block component comprising a segment derived from an aromatic diamine compound of a rigid structure and an aromatic tetracarboxylic acid compound;
   said random component comprising a segment derived from an aromatic diamine compound of a flexible structure and at least two types of aromatic tetracarboxylic acid compounds;
   said aromatic diamine compound of a rigid structure being present in an amount from 12 mol % to 30 mol % of the total aromatic diamines used to make said polyimide copolymer; and
   said aromatic diamine compound of a flexible structure being present in an amount from 70 mol % to 88 mol % of the total aromatic diamines used to make said polyimide copolymer.

2. The polyimide film of claim 1 wherein the coefficient of thermal expansion is 10 to 22 ppm/° C.

3. The polyimide film of claim 1 in which the aromatic diamine of rigid structure is represented by formula (I) below:

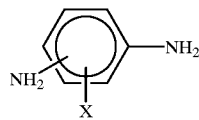

(I)

wherein X is a monovalent substitution group selected from the group consisting of hydrogen, halogen groups, carboxyl groups, lower alkyl groups and lower alkoxy groups.

4. The polyimide film of claim 3 wherein X in formula (I) is hydrogen.

5. The polyimide film of claim 3 in which the aromatic diamine compound having a rigid structure is p-phenylenediamine.

6. The polyimide film of claim 1 wherein the aromatic diamine compound having a flexible structure is a diamine represented by formula (II) below:

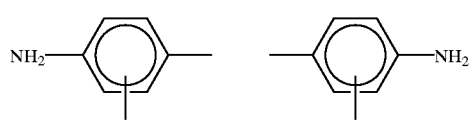

(II)

wherein X and Y are monovalent substitution groups that are selected from the group consisting of hydrogen, halogen groups, carboxyl groups, lower alkyl groups and lower alkoxy groups and X and Y are substitution groups that are the same or different; and A is a divalent coupling group that is selected from the group consisting of —O—, —S—, —CO—, —SO—, SO2— and —CH₂—.

7. The polyimide film of claim 1 wherein the aromatic diamine compound having a flexible structure is represented by formula (III) below

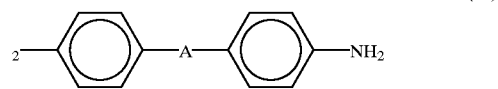

(III)

wherein A is a divalent coupling group that is selected from the group consisting of —O—, —S—, —CO—, —SO—, SO2— and —CH₂—.

8. The polyimide film of claim 7 wherein the aromatic diamine compound having a flexible structure is 4,4'-diaminodiphenyl ether.

9. The polyimide film as described of claim 1 wherein the aromatic tetracarboxylic compound is at least one compound selected from the group consisting of pyromellitic acid compounds, 3,3'-4,4'-biphenyltetra-carboxylic acid compounds and 3,3'-4,4'-benzophenonetetracarboxylic acid compounds.

10. The polyimide film of claim 9 wherein the pyromellitic acid compounds constitute from 50 mol % to 80 mol % of the total aromatic tetracarboxylic acid component and wherein the 3,3'-4,4'-biphenyltetracarboxylic acid compounds and/or 3,3'-4,4'-benzophenonetetracarboxylic acid compounds constitute from 20 mol % to 50 mol % of the total aromatic tetracarboxylic acid component.

11. A metal laminated plate comprising a polyimide film having laminated thereto a metal layer, wherein the polyimide film comprises the film of claim 1.

12. The metal laminated plate of claim 11 wherein an adhesive agent is present between the polyimide film and the metal layer.

13. A method for the manufacture of polyimide film comprising the steps of:
   (1) mixing an aromatic diamine compound having a rigid structure and an aromatic tetracarboxylic acid compound in an organic solvent that is nonreactive with the reaction components for the time required for reaction, wherein the ratio of the aromatic tetracarboxylic acid compound to the aromatic diamine compound having a rigid structure is 95 to 105 mol %;
   (2) adding an aromatic diamine compound having a flexible structure to the solution formed in step (1) followed by adding of an aromatic tetracarboxylic acid compound (A) and an aromatic tetracarboxylic acid compound (B), which is different from (A), so that the total aromatic tetracarboxylic acid compound and total aromatic diamine component are in an essentially equimolar quantity, and mixing these substances for the time required for reaction to form a copolymerized polyamic acid solution, said aromatic diamine compound of a rigid structure being present in an amount from 12 mol % to 30 mol % of the total aromatic diamines used to make said polyimide copolymer and said aromatic diamine compound of a flexible structure being present in an amount from 70 mol % to 88 mol % of the total aromatic diamines used to make said polyimide copolymer;

(3) casting said copolymerized polyamic acid solution in the shape of a film;

(4) cyclizing the copolymerized polyamic acid solution; and (5) drawing the cyclized polyamic acid solution, eliminating the solvent and effecting formation to form the polyimide film.

14. The method for the manufacture of copolymerized polyimide film of claim 11 wherein cyclization is performed by the chemical cyclization method using a cyclization catalyst and a dehydrating agent.

* * * * *

UNITED STATES PATENT AND TRADEMARK OFFICE
CERTIFICATE OF CORRECTION

PATENT NO. : 6,277,495 B1
DATED : August 21, 2001
INVENTOR(S) : Koichi Sawasaki, Kenji Uhara and Michihiro Kubo It is certified that error appears in the above-identified patent and that said Letters Patent is hereby corrected as shown below:

Title page,
Item [73], Assignee, delete "E. I. du Pont de Nemours and Company, Wilmington, DE (US)" and substitute -- DuPont-Toray Company, Ltd., Tokyo (JAPAN) -- therefor.

Column 11,
Lines 60-65, delete

"
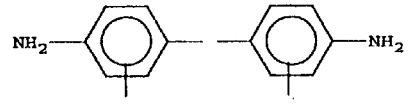
"

and substitute

--
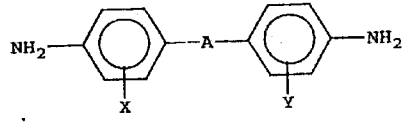
-- therefor.

Column 12,
Line 5, delete "SO2" and substitute -- $SO_2$ -- therefor.

UNITED STATES PATENT AND TRADEMARK OFFICE
CERTIFICATE OF CORRECTION

PATENT NO.    : 6,277,495 B1
DATED         : August 21, 2001
INVENTOR(S)   : Koichi Sawasaki, Kenji Uhara and Michihiro Kubo It is certified that error appears in the above-identified patent and that said Letters Patent is hereby corrected as shown below:

Column 12 cont'd,
Lines 10 through 15, delete

" (III) "

and substitute

-- 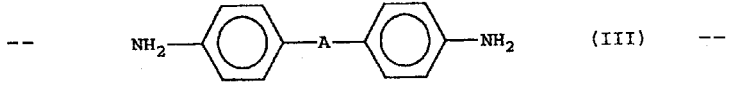 (III) -- therefor.

Line 19, delete "SO2" and substitute -- $SO_2$ -- therefor.

Signed and Sealed this

Seventeenth Day of December, 2002

JAMES E. ROGAN
*Director of the United States Patent and Trademark Office*